US007205169B2

(12) United States Patent
Chang

(10) Patent No.: US 7,205,169 B2
(45) Date of Patent: Apr. 17, 2007

(54) DRIVING CIRCUIT FOR AMOLED DISPLAY AND DRIVING METHOD THEREOF

(75) Inventor: Yi-Cheng Chang, Taipei (TW)

(73) Assignee: AU Optronics Corp., Hsinchu (TW)

( * ) Notice: Subject to any disclaimer, the term of this patent is extended or adjusted under 35 U.S.C. 154(b) by 0 days.

(21) Appl. No.: 11/326,861

(22) Filed: Jan. 6, 2006

(65) Prior Publication Data

US 2006/0160255 A1 Jul. 20, 2006

(30) Foreign Application Priority Data

Sep. 29, 2005 (TW) .............................. 94133966 A

(51) Int. Cl.
*H01L 21/00* (2006.01)
*H01L 33/00* (2006.01)

(52) U.S. Cl. ............................ 438/22; 438/28; 438/34; 257/79; 257/88; 257/E33.013

(58) Field of Classification Search .................. 438/22, 438/26, 28, 34, 66; 345/76, 82, 83; 257/40, 257/79, 88, E33.013
See application file for complete search history.

(56) References Cited

U.S. PATENT DOCUMENTS

| | | | | |
|---|---|---|---|---|
| 6,693,388 | B2 * | 2/2004 | Oomura | 345/76 |
| 2005/0110420 | A1 * | 5/2005 | Arnold et al. | 315/169.3 |
| 2005/0190171 | A1 * | 9/2005 | Jang et al. | 345/204 |
| 2006/0125734 | A1 * | 6/2006 | Cok et al. | 345/76 |
| 2006/0132400 | A1 * | 6/2006 | Cok et al. | 345/81 |

* cited by examiner

*Primary Examiner*—Kevin M. Picardat
(74) *Attorney, Agent, or Firm*—Thomas, Kayden, Horstemeyer & Risley

(57) ABSTRACT

A driving circuit and method for an active matrix organic light emitting diode (AMOLED) display are provided. The driving circuit comprises a power circuit, a linear thermistor, and a pixel circuit. The power circuit provides an equivalent current. The linear thermistor coupled to the power circuit adjusts the equivalent current according to the temperature of the AMOLED display. The pixel circuit coupled to the power circuit comprises a driving transistor and a light emitting device. The driving transistor comprises a first end coupled to the power circuit, and the light emitting device coupled to a second end of the driving transistor is driven by the equivalent current to illuminate.

23 Claims, 8 Drawing Sheets

DRIVING CIRCUIT FOR AMOLED DISPLAY AND DRIVING METHOD THEREOF

BACKGROUND OF THE INVENTION

1. Field of the Invention

The present invention relates to an active matrix OLED display, and in particular, to power circuits that compensate temperature variations when driving the display.

2. Description of the Related Art

FIG. 1 shows a pixel circuit of a conventional active matrix OLED display. A capacitor 104 is coupled to the gate of a driving transistor 106, and an OLED 102 is coupled to the drain of the driving transistor 106. The source of the driving transistor 106 is coupled to a terminal VDD, and the other end of the OLED 102 is coupled to a terminal VSS. The pixel circuit shown is an abstract concept, in which the driving transistor 106 may be a PMOS or an NMOS, and the OLED 102 may also be coupled to the terminal VDD and the driving transistor 106. Thousands of variations of detailed implementations are present and known to the art. The major principle is that the capacitor 104 determines brightness of the pixel circuit, and the OLED 102 illuminates in response to the current flowing from terminal VDD to terminal VSS controlled by the driving transistor 106. The terminal VDD and terminal VSS are provided by a power circuit (not shown). The OLED 102 and driving transistor 106 may be influenced by environmental temperature and manufacturing inaccuracy, and as a result, unstable illumination is induced in the pixel circuit.

FIG. 2 shows the relationships between conventional pixel brightness and temperature. The horizontal axis is temperature, and vertical axis a normalized value. The terminal VDD and terminal VSS are not influenced as temperature varies, but the brightness is proportional to the temperature. Temperature compensation is therefore desirable for driving the pixel circuit.

BRIEF SUMMARY OF INVENTION

It is an object of the present invention to provide a driving circuit for an active matrix organic light emitting diode (AMOLED) display. An exemplary embodiment of a driving circuit for an AMOLED display comprises a power circuit, a linear thermistor, and a pixel circuit. The power circuit provides an equivalent current. The linear thermistor coupled to the power circuit adjusts the equivalent current according to the temperature of the AMOLED display. The pixel circuit coupled to the power circuit comprises a driving transistor and a light emitting device. The driving transistor comprises a first end coupled to the power circuit, and the light emitting device coupled to a second end of the driving transistor is driven by the equivalent current to illuminate.

The pixel circuit may comprise a switch transistor, electrically coupled to a gate of the driving transistor. The pixel circuit may comprise a capacitor coupled to the gate of the driving transistor. The power circuit may comprise a first end providing the equivalent current, a second end coupled to the first end of the linear thermistor, and a third end coupled to the second end of the linear thermistor. The driving circuit may also comprise a resistor having a first end coupled to the first end of the linear thermistor, and a second end coupled to ground. The resistance of the thermistor is in reverse proportion to the temperature, and thus the equivalent current is in reverse proportion to the temperature.

A method for driving the AMOLED display is also provided. Temperature of the AMOLED is detected. An equivalent current is generated by the power circuit based on the temperature of the AMOLED. The light emitting device is driven by the equivalent current to illuminate. The equivalent current is in reverse proportion to the temperature.

BRIEF DESCRIPTION OF DRAWINGS

The present invention can be more fully understood by reading the subsequent detailed description and examples with references made to the accompanying drawings, wherein.

DETAILED DESCRIPTION OF INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 3A:
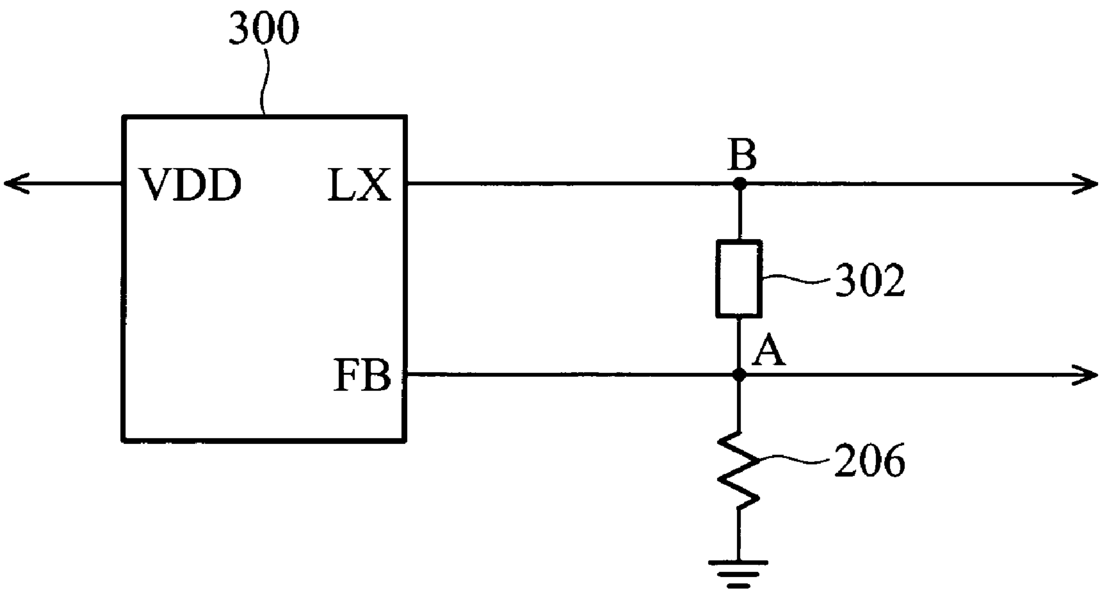
FIGS. 3*a* and 3*b* are schematic illustrations showing power units according to an embodiment of the invention.

FIG. 3*a* shows an embodiment of a power unit according to the invention. A power circuit 300 comprises three terminals, in which a terminal LX and a terminal FB are coupled to a linear thermistor 302. The terminal FB is also coupled to ground via a resistor 206. A feedback loop is thus formed by the terminal LX and terminal FB. A node A has an electrical potential proportional to the ratio of the linear thermistor 302 to the resistor 206 based on the voltage division law. The terminal FB detects the potential on the node A as a reference for a terminal VDD, and the terminal VDD is coupled to the pixel circuit in FIG. 1 as a power supply. In this case, the linear thermistor 302 is in reverse proportion to the temperature, thus, the potential detected by the terminal FB is proportional to the temperature. An equivalent current output from the terminal VDD of power circuit 300 is also in reverse proportion to the temperature. The light emitting device employed in the embodiment is specifically chosen to be an active matrix OLED. The terminal VDD of power circuit 300 is not necessarily coupled to the terminal VDD of the pixel circuit, and may also couple to a terminal VSS. The linear thermistor 302 coupled to the terminal LX and terminal FB is not necessarily based on the voltage division law. The pixel circuit is not restricted to be voltage driven or current driven. Any pixel circuit utilizing linear thermistor 302 to compensate temperature effect for illumination meets the goal of the invention.

Figure 1:
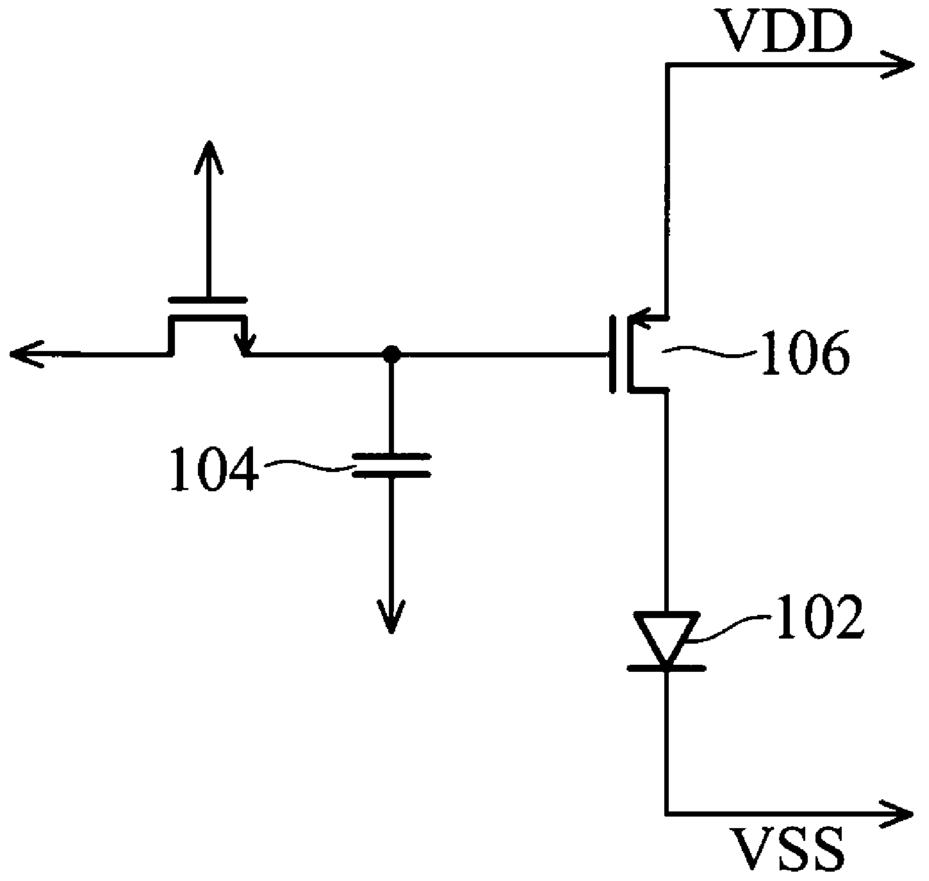
FIG. 1 shows a conventional active matrix OLED display.
Figure 2:
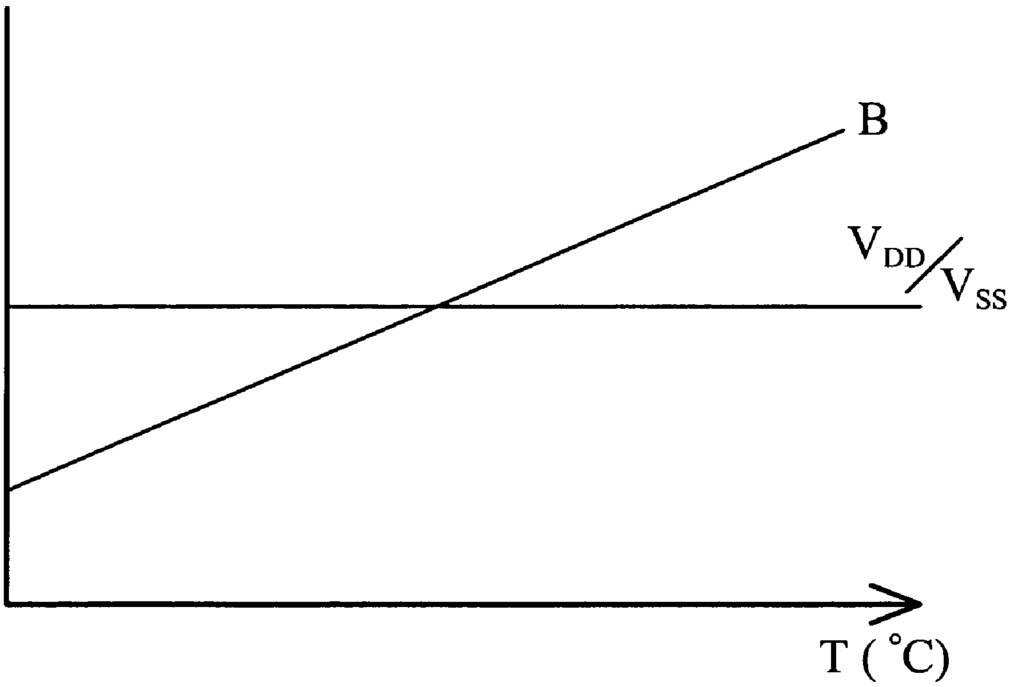
FIG. 2 is a diagram showing relationships between conventional brightness and temperature.
Figure 3B:
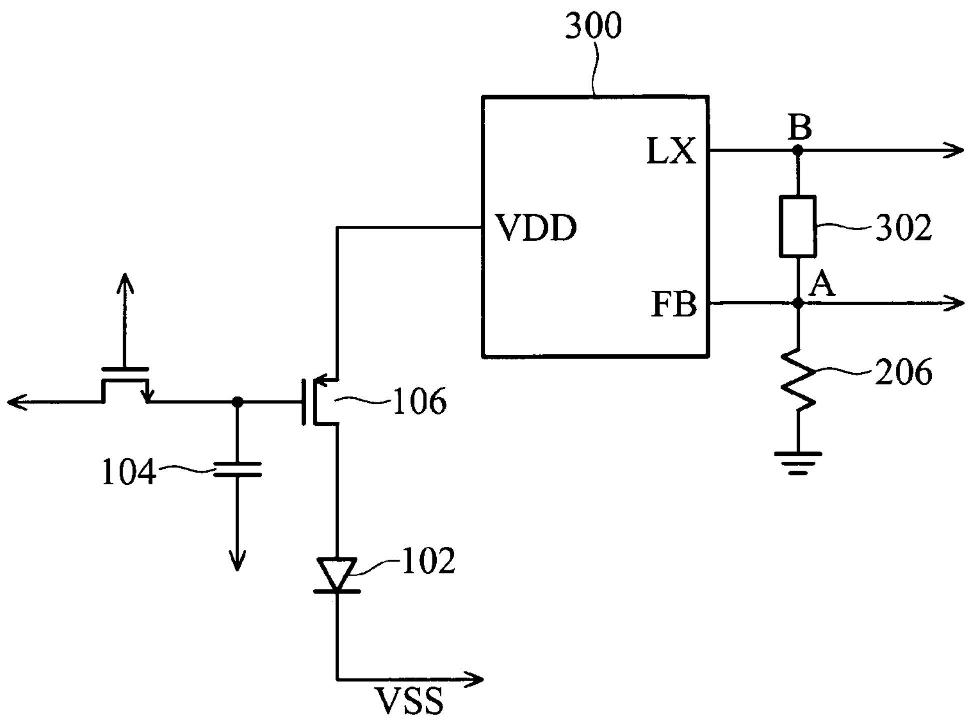

FIG. 3*b* is an embodiment according to FIG. 3*a*. The terminal VDD is coupled to the pixel circuit as shown in FIG. 1. A capacitor 104 is coupled to the gate of a driving transistor 106, and an OLED 102 is coupled to the drain of the driving transistor 106. The source of driving transistor 106 is coupled to the terminal VDD, and the other terminal of the OLED 102 is coupled to the terminal VSS. The pixel circuit shown is an abstract concept, in which the driving transistor 106 may be a PMOS or an NMOS, and the OLED 102 may also be coupled to the terminal VDD and the driving transistor 106. Thousands of variations of detailed implementations are present and known to the art. The major principle is that the capacitor 104 determines brightness of the pixel circuit, and the OLED 102 illuminates in response to the current flowing from the terminal VDD to the terminal VSS controlled by the driving transistor 106.

Figure 4A:
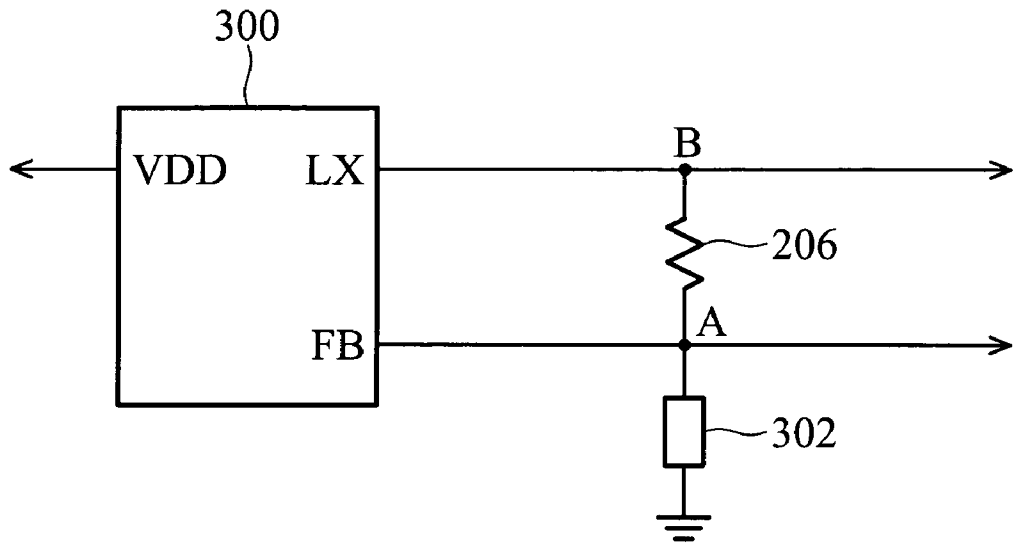
FIGS. 4*a* and 4*b* are schematic illustrations showing power units according to another embodiment of the invention.

FIG. 4*a* shows a power unit according to another embodiment of the invention. Similarly, the power circuit 300 comprises three terminals. A resistor 206 is coupled to a terminal LX and a terminal FB, and the terminal FB is also coupled to ground via a linear thermistor 302. A feedback loop is thus formed between the terminal LX and terminal FB. A node A has an electrical potential proportional to the ratio of linear thermistor 302 to resistor 206 based on the voltage division law. The terminal FB detects the potential on the node A as a reference for a terminal VDD, and the terminal VDD is coupled to the pixel circuit in FIG. 1 as a power supply. In this case, the linear thermistor 302 is proportional to the temperature, thus the potential detected by the terminal FB is in reverse proportion to the temperature. An equivalent current output from the terminal VDD of the power circuit 300 is also in reverse proportion to the temperature. The light emitting device employed in the embodiment is specifically chosen to be an OLED. The terminal VDD of the power circuit 300 is not necessarily coupled to the terminal VDD of the pixel circuit, and may also couple to a terminal VSS. The linear thermistor 302 coupled to the terminal LX and terminal FB is not necessarily. based on the voltage division law. The pixel circuit is not restricted to be voltage driven or current driven. Any pixel circuit utilizing the linear thermistor 302 to compensate temperature effect for illumination meets the goal of the invention.

Figure 4B:
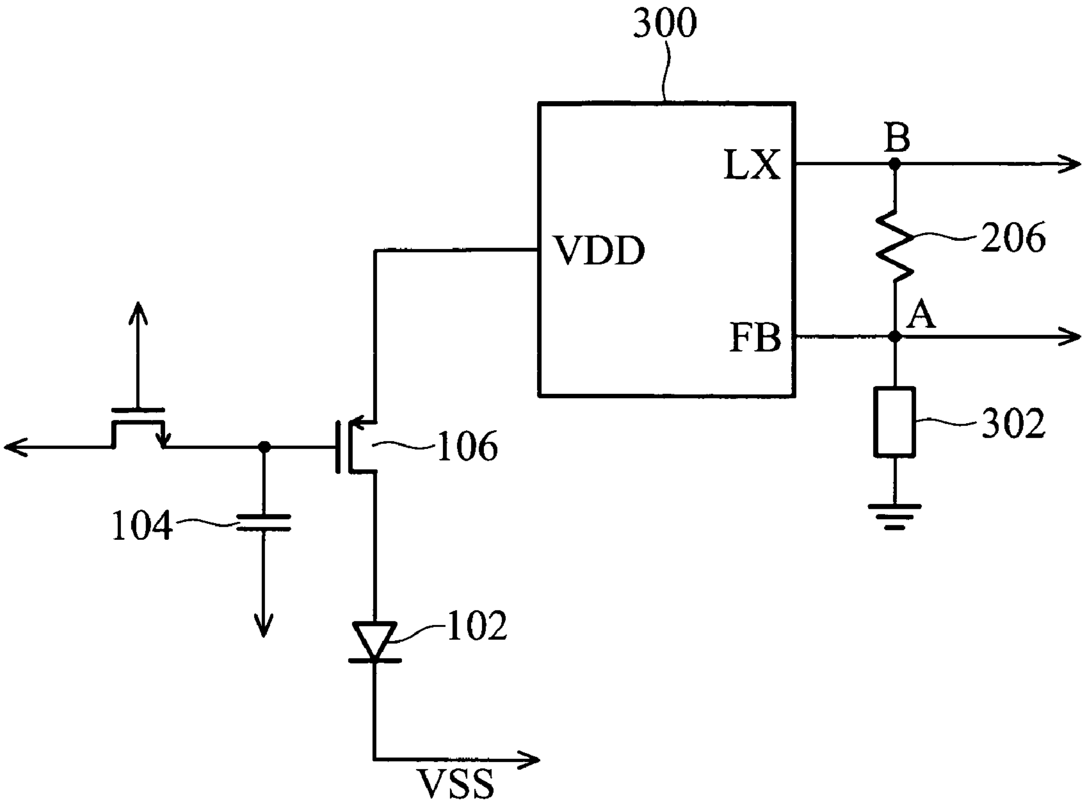

FIG. 4*b* is an embodiment according to FIG. 4*a*. The terminal VDD is coupled to the pixel circuit as shown in FIG. 1. A capacitor 104 is coupled to the gate of a driving transistor 106, and an OLED 102 is coupled to the drain of the driving transistor 106. The source of the driving transistor 106 is coupled to the terminal VDD, and the other terminal of OLED 102 is coupled to the terminal VSS. The pixel circuit shown is an abstract concept, in which the driving transistor 106 may be a PMOS or an NMOS, and the OLED 102 may also be coupled to the terminal VDD and the driving transistor 106. Thousands of variations of detailed implementations are present and known to the art. The major principle is that the capacitor 104 determines brightness of the pixel circuit, and the OLED 102 illuminates in response to the current flowing from the terminal VDD to the terminal VSS controlled by the driving transistor 106.

Figure 5:
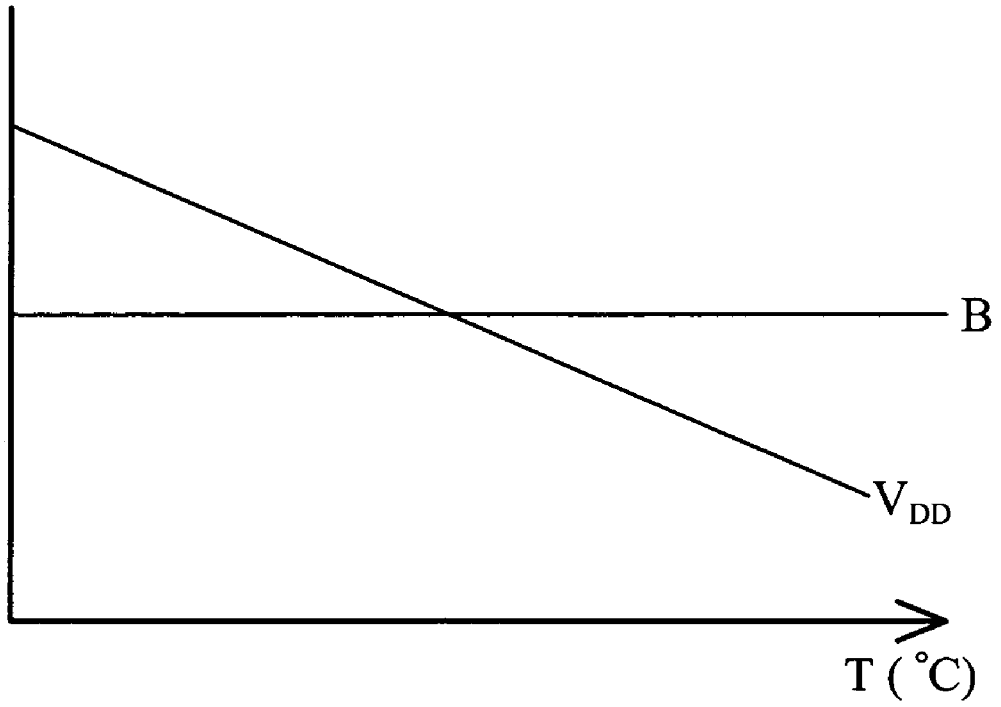
FIG. 5 shows the relationships between brightness and temperature according the invention.

FIG. 5 shows a relationship between brightness and temperature according to the invention. The terminal VDD of the power circuit 300 is in reverse proportion to the temperature. The linear thermistor 302 varies with temperature to compensate the terminal VDD, such that brightness is kept consistent. As the pixel circuit implementation varies, the power circuit 300 may provide a terminal VDD proportional or reverse proportional to the temperature through the linear thermistor 302, and the terminal VDD may be coupled to the terminal VDD terminal or terminal VSS terminal of the pixel circuit. The major goal of the invention is to provide a linear thermistor to compensate the temperature variation, such that the AMOLED illuminates with consistency.

Figure 6:
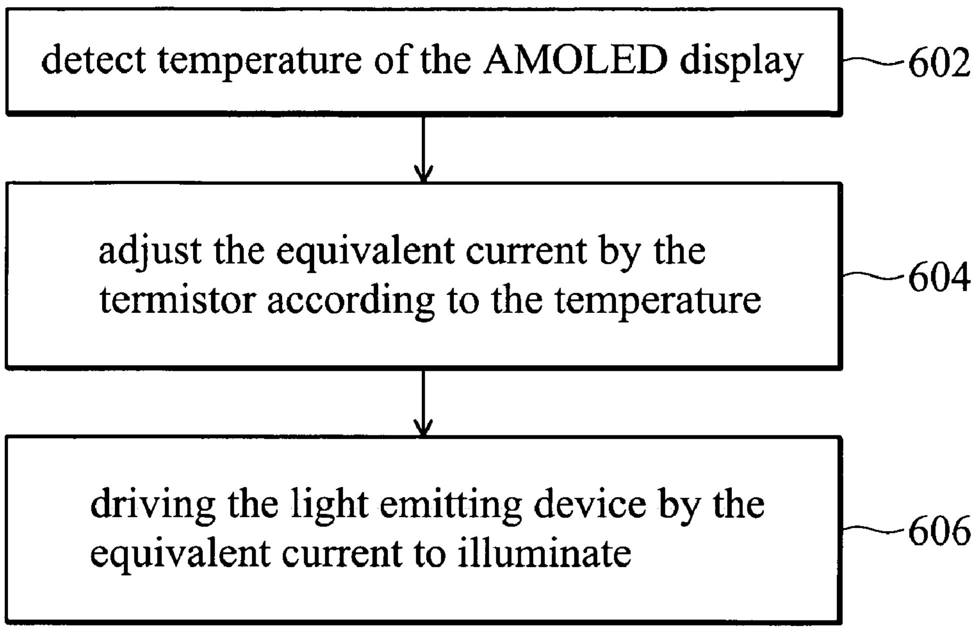
FIG. 6 is a flowchart of a driving method according to the invention.

FIG. 6 is a flowchart of the driving method according to the invention. In step 602, the temperature of the active matrix OLED display is detected. In step 604, the equivalent current of the power circuit is adjusted through the linear thermistor according to the temperature of the active matrix OLED display. In step 606, the light emitting device is driven by the equivalent current to illuminate. The equivalent current output from the terminal VDD of the power circuit is in reverse proportion to the temperature, thus the brightness of the light emitting device remains constant as temperature varies.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A driving circuit for an active matrix organic light emitting diode (AMOLED) display, comprising:
- a power circuit for providing an equivalent current;
- a linear thermistor, coupled to the power circuit, adjusting the equivalent current according to the temperature of the AMOLED display; and
- a pixel circuit, coupled to the power circuit, comprising:
- a driving transistor, including a first end and a second end, the first end of the driving transistor being coupled to the power circuit; and
- a light emitting device coupled to the second end of the driving transistor and driven by the equivalent current to emit light.

2. The driving circuit as claimed in claim 1, wherein the driving transistor further includes a gate, and the pixel circuit further comprises a switch transistor electrically coupled to the gate of the driving transistor.

3. The driving circuit as claimed in claim 2, wherein the pixel circuit further comprises a capacitor coupled to the gate of the driving transistor.

4. The driving circuit as claimed in claim 1, wherein the linear thermistor includes a first end and a second end, and the power circuit comprises:
- a first end for providing the equivalent current;
- a second end coupled to the first end of the linear thermistor; and
- a third end coupled to the second end of the linear thermistor.

5. The driving circuit as claimed in claim 4, further comprising a resistor having a first end coupled to the first end of the linear thermistor and a second end grounded.

6. The driving circuit as claimed in claim 5, wherein the resistance of the linear thermistor is in reverse proportion to the temperature, such that the equivalent current is in reverse proportion to the temperature.

7. The driving circuit as claimed in claim 1, wherein the linear thermistor includes a first end and a second end, and the power circuit comprises:
- a first end for providing the equivalent current; and
- a second end coupled to the first end of the linear thermistor, wherein the second end of the linear thermistor is grounded.

8. The driving circuit as claimed in claim 7, further comprising a resistor having a first end and a second end, wherein the first end of the resistor is coupled to the first end of the linear thermistor, and the power circuit further comprises a third end coupled to the second end of the resistor.

9. The driving circuit as claimed in claim 8, wherein the resistance of the linear thermistor is in proportion to temperature, such that the equivalent current is in reverse proportion to the temperature.

10. The driving circuit as claimed in claim 1, wherein the light emitting device is an OLED.

11. A method for driving an AMOLED display having a power circuit, a linear thermistor coupled to the power circuit, and a pixel circuit having a driving transistor and a light emitting device, wherein the driving transistor has a first end coupled to the power circuit, and a second end coupled to the light emitting device, the method comprising:

detecting temperature of the AMOLED;

adjusting an equivalent current of the power circuit according to the temperature of the AMOLED; and driving the light emitting device by the equivalent current to emit light.

12. The method as claimed in claim 11, wherein the equivalent current is in reverse proportion to the temperature.

13. A driving circuit for an active matrix organic light emitting diode (AMOLED) display, comprising:

a power circuit for providing an equivalent current;

a linear thermistor, coupled to the power circuit, adjusting the equivalent current according to the temperature of the AMOLED display; and a pixel circuit, coupled to the power circuit, comprising:

a driving transistor, including a gate, a first end and a second end, the first end of the driving transistor being coupled to the power circuit;

a capacitor coupled to the gate of the driving transistor, storing charges proportional to a data signal; and a light emitting device coupled to the second end of the driving transistor and driven by the equivalent current to emit light based on the charges stored in the capacitor.

14. The driving circuit as claimed in claim 13, wherein the pixel circuit further comprises a switch transistor electrically coupled to the gate of the driving transistor.

15. The driving circuit as claimed in claim 13, wherein the linear thermistor includes a first end and a second end, and the power circuit comprises:

a first end for providing the equivalent current;

a second end coupled to the first end of the linear thermistor; and a third end coupled to the second end of the linear thermistor.

16. The driving circuit as claimed in claim 15, further comprising a resistor having a first end coupled to the first end of the linear thermistor and a second end grounded.

17. The driving circuit as claimed in claim 16, wherein the resistance of the linear thermistor is in reverse proportion to the temperature, such that the equivalent current is in reverse proportion to the temperature.

18. The driving circuit as claimed in claim 13, wherein the linear thermistor includes a first end and a second end, and the power circuit comprises:

a first end for providing the equivalent current; and a second end coupled to the first end of the linear thermistor, wherein the second end of the linear thermistor is grounded.

19. The driving circuit as claimed in claim 18, further comprising a resistor having a first end and a second end, wherein the first end of the resistor is coupled to the first end of the linear thermistor, and the power circuit further comprises a third end coupled to the second end of the resistor.

20. The driving circuit as claimed in claim 19, wherein the resistance of the linear thermistor is in proportion to temperature, such that the equivalent current is in reverse proportion to the temperature.

21. The driving circuit as claimed in claim 13, wherein the light emitting device is an OLED.

22. A method for driving an AMOLED display having a power circuit, a linear thermistor coupled to the power circuit, and a pixel circuit having a driving transistor and a light emitting device, wherein the driving transistor has a first end coupled to the power circuit, and a second end coupled to the light emitting device, the method comprising:

detecting temperature of the AMOLED;

adjusting an equivalent current of the power circuit according to the temperature of the AMOLED;

storing charges proportional to a data signal; and driving the light emitting device by the equivalent current to emit light based on the charges stored.

23. The method as claimed in claim 22, wherein the equivalent current is in reverse proportion to the temperature.

* * * * *